US009053839B2

(12) United States Patent
Lövenich

(10) Patent No.: US 9,053,839 B2
(45) Date of Patent: Jun. 9, 2015

(54) DISPERSIONS COMPRISING POLYTHIOPHENES WITH A DEFINED CONTENT OF THIOPHENE MONOMER

(75) Inventor: Wilfried Lövenich, Bergisch Gladbach (DE)

(73) Assignee: Heraeus Precious Metals GmbH & Co. KG, Hanau (DE)

( * ) Notice: Subject to any disclaimer, the term of this patent is extended or adjusted under 35 U.S.C. 154(b) by 0 days.

(21) Appl. No.: 13/879,195

(22) PCT Filed: Oct. 7, 2011

(86) PCT No.: PCT/EP2011/005020

§ 371 (c)(1), (2), (4) Date: Jun. 18, 2013

(87) PCT Pub. No.: WO2012/048823

PCT Pub. Date: Apr. 19, 2012

(65) Prior Publication Data

US 2013/0261261 A1 Oct. 3, 2013

Related U.S. Application Data

(60) Provisional application No. 61/471,854, filed on Apr. 5, 2011.

(30) Foreign Application Priority Data

Oct. 12, 2010 (DE) ........................ 10 2010 048 032

(51) Int. Cl.
*C08G 75/00* (2006.01)
*H01B 1/12* (2006.01)
(Continued)

(52) U.S. Cl.
CPC ........ *H01B 1/127* (2013.01); *C08G 2261/1424* (2013.01); *C08G 2261/3223* (2013.01);
(Continued)

(58) Field of Classification Search
USPC ........................................ 528/380, 373, 377
See application file for complete search history.

(56) References Cited

U.S. PATENT DOCUMENTS

| | | | |
|---|---|---|---|
| 4,705,868 | A | 11/1987 | Deschler et al. |
| 6,756,473 | B2 | 6/2004 | Reuter et al. |

(Continued)

FOREIGN PATENT DOCUMENTS

| | | |
|---|---|---|
| DE | 102008005568 | 7/2009 |
| DE | 102008059389 | 6/2010 |

(Continued)

OTHER PUBLICATIONS

"Written Opinion in PCT/EP2011/005020", mailed on Feb. 6, 2012 , 6 pgs.

(Continued)

*Primary Examiner* — Shane Fang
(74) *Attorney, Agent, or Firm* — Servilla Whitney LLC

(57) ABSTRACT

The present invention relates to a method for producing a composition comprising polythiophene, comprising the method steps: I) provision of a composition Z1 comprising thiophene monomers and an oxidising agent; II) oxidative polymerisation of the thiophene monomers by reducing the oxidising agent to a reduction product and oxidation of the thiophene monomer, to form a polythiophene and a composition Z2 comprising the reduction product; III) at least partial removal of the reduction product from the composition Z2 obtained in method step II), to obtain a composition Z3; wherein it is ensured that, following completion of method step III), the content of non-polymerised thiophene monomer in the composition Z3 is in the range from 1 ppm to 100 ppm, based on the total weight of the composition Z3. The present invention also relates to a composition obtainable as the composition Z3 produced with this method, a composition comprising a polythiophene, a layer construction, an electronic component and the use of a composition.

23 Claims, 2 Drawing Sheets

(51) Int. Cl.

| | |
|---|---|
| ***C08L 25/18*** | (2006.01) |
| ***C08L 65/00*** | (2006.01) |
| ***C09D 125/18*** | (2006.01) |
| ***H01L 51/00*** | (2006.01) |
| ***H01G 11/48*** | (2013.01) |
| ***H01G 11/56*** | (2013.01) |

(52) U.S. Cl.

CPC ........ *C08G2261/51* (2013.01); *C08G 2261/71* (2013.01); *C08G 2261/794* (2013.01); *C08L 25/18* (2013.01); *C08L 65/00* (2013.01); *C09D 125/18* (2013.01); *H01L 51/0037* (2013.01); *H01G 11/48* (2013.01); *H01G 11/56* (2013.01); *Y02E 60/13* (2013.01)

(56) References Cited

U.S. PATENT DOCUMENTS

| | | | |
|---|---|---|---|
| 7,338,620 | B2 | 3/2008 | Hsu |
| 2002/0077450 | A1 | 6/2002 | Kirchmeyer et al. |
| 2005/0053801 | A1 | 3/2005 | Elschner et al. |
| 2005/0129857 | A1 | 6/2005 | Pollack et al. |
| 2007/0117961 | A1 | 5/2007 | Toth et al. |
| 2011/0049433 | A1 | 3/2011 | Jonas et al. |
| 2012/0057275 | A1 | 3/2012 | Intelmann et al. |

FOREIGN PATENT DOCUMENTS

| | | |
|---|---|---|
| DE | 102009007594 | 8/2010 |
| EP | 215224 | 3/1987 |
| EP | 1215224 | 6/2002 |
| EP | 1505664 | 2/2005 |
| JP | 2000-090732 | 3/2000 |
| JP | 2003-261573 | 9/2003 |
| JP | 2007-529608 | 10/2007 |
| JP | 2008-171761 | 7/2008 |
| JP | 2009-001624 | 1/2009 |

OTHER PUBLICATIONS

Jang, Keon-Soo et al., "Synchronous vapor-phase polymerization of (3,4-ethylendioxithiop hene) and poly(3-hexylthiophene) copolymer systems fot tunable optoelectronic properties", *Organic Electronics* vol. 11 2010 , pp. 1668-1675.

Winther-Jensen, Bjorn et al., "Vapor-Phase Polymerization of 3,4-Ethylenedioxythiphene: A Route to Highly Conducting Polymer Surface Layers", *Macromolecules*, vol. 37 2004 , pp. 4538-4543.

DISPERSIONS COMPRISING POLYTHIOPHENES WITH A DEFINED CONTENT OF THIOPHENE MONOMER

CROSS-REFERENCE TO RELATED APPLICATIONS

This application is the national stage entry of PCT/EP2011/005020, filed on Oct. 7, 2011, which claims priority to German Patent application number 102010048032.0, filed on Oct. 12, 2010 and U.S. Provisional application No. 61/471,854, filed on Apr. 5, 2011, all of which are incorporated herein by reference in their entireties.

The present invention relates to a method for producing compositions comprising a polythiophene, a composition obtainable by means of said method, a composition comprising a polythiophene, a layer construction, an electronic component, and the use of a composition.

Conductive polymers are growing in commercial importance, since polymers have advantages over metals with regard to processability, weight and the targeted adjustment of properties by means of chemical modification. Examples of known π-conjugated polymers are polypyrroles, polythiophenes, polyanilines, polyacetylenes, polyphenylenes and poly(p-phenylene-vinylenes). Layers made from conductive polymers are used in many technical fields, for example, as polymer counter electrodes in capacitors or for through-contacting in electronic circuit boards. The production of conductive polymers is achieved chemically or electrochemically by oxidation from monomer precursors, for example, optionally substituted thiophenes, pyrroles and anilines and their respective, optionally oligomeric, derivatives. Chemical oxidative polymerisation, in particular, is widely used, since it can be achieved easily in a liquid medium and on many different substrates.

A particularly important and technically used polythiophene is poly(ethylene-3,4-dioxythiophene) (PEDOT or PEDT) disclosed, for example, in EP 0 339 340 A2, which is produced by chemical polymerisation of ethylene-3,4-dioxythiophene (EDOT or EDT) and has very good conductivity in its oxidised form. An overview of numerous poly(alkylene-3,4-dioxythiophene) derivatives, particularly poly(ethylene-3,4-dioxythiophene) derivatives, their monomer components, synthesis and uses is set out by L. Groenendaal, F. Jonas, D. Freitag, H. Pielartzik & J. R. Reynolds in Adv. Mater. 12, (2000) pp. 481-494.

Of particular technical importance are the dispersions of PEDOT with polyanions disclosed for example in EP 0 440 957 A2, for example, polystyrene sulfonic acid (PSS). From these dispersions, transparent conductive films can be produced, for which many uses have been found, for example as an antistatic coating or as a hole injection layer in organic light-emitting diodes (OLEDs) as disclosed in EP 1 227 529 A2.

The polymerisation of EDOT takes place in an aqueous solution of the polyanion and a polyelectrolyte complex is formed. Cationic polythiophenes which comprise polymeric anions as counterions for charge compensation are also often known among experts as polythiophene/polyanion-complexes (PEDOT/PSS complexes). Due to the polyelectrolyte properties of PEDOT as a polycation and of PSS as a polyanion, this complex is not a true solution but rather a dispersion. The extent to which polymers or parts of polymers are dissolved or dispersed depends on the mass ratio of the polycation and the polyanion, the charge densities of the polymers, the salt concentration in the surroundings and on the nature of the surrounding medium (V. Kabanov, Russian Chemical Reviews 74, 2005, 3-20). These transitions can be fluid. For this reason, no distinction is made in the following between the expressions "dispersed" and "dissolved". Similarly, no distinction is made between "dispersing" and "dissolving" or between "dispersant" and "solvent". Rather, these expressions are used here as equivalent.

The disadvantage of the dispersions of electrically conductive polymers described in the prior art, particularly in relation to the PEDOT/PSS dispersions known from the prior art, is that they tend, on long storage, to "gel". This gelling of the dispersion manifests itself, inter alia, therein that if, for example, the dispersion is poured out of a vessel, the dispersion does not flow evenly, but leaves behind regions in which hardly any dispersion remains. A non-uniform flow of the material is often to be seen, which is characterised by frequent rupturing. On substrates onto which the dispersion is applied for coating purposes, it also spreads out very unevenly. However, since PEDOT/PSS dispersions are often used for producing electrically conductive layers and therefore have to be applied to substrate surfaces, this gelling also decisively influences the homogeneity and thus the electrical properties of the PEDOT/PSS layer. Furthermore, the PEDOT/PSS dispersions known from the prior art are also characterised in that the layers obtained with such dispersions often have an electrical conductivity that is in need of improvement.

It is therefore an object of the present invention to overcome the disadvantages of the prior art associated with compositions comprising polythiophenes, particularly associated with PEDOT/PSS dispersions and with laminated bodies produced from such compositions or from said dispersions.

In particular, it is an object of the present invention to provide a method for producing a composition comprising polythiophenes, preferably a PEDOT/PSS dispersion which is characterised in particular by hardly any or, preferably no, tendency to gel even after a long storage time.

Furthermore, the composition or dispersion obtainable with this method should be thereby distinguished that a layer produced from said composition or dispersions is characterised by having a particularly high electrical conductivity.

It was therefore also an object of the present invention to provide a composition comprising polythiophenes, and preferably a PEDOT/PSS dispersion which, compared with the compositions or dispersions known from the prior art, is characterised by a particularly advantageous combination of the properties of good processability and high electrical conductivity in a layer produced therefrom.

A further object of the invention lies in fulfilling a requirement for dispersions for touch panels which enable the production of transparent layers with high flexibility, obtainable, in particular, by means of a printing process. By this means, touch panels with a high degree of flexibility and transmission but low energy consumption and manufacturing costs can be obtained.

A contribution to solving these problems is made by a method for producing a composition comprising a polythiophene, comprising the method steps:

I) provision of a composition Z1 comprising thiophene monomers and an oxidising agent;

II) oxidative polymerisation of the thiophene monomers by reducing the oxidising agent to a reduction product and oxidation of the thiophene monomer, to form a composition Z2 comprising a polythiophene and the reduction product;

III) at least partial removal of the reduction product from the composition Z2 obtained in method step II), to obtain a composition Z3;

wherein it is ensured that the content of non-polymerised thiophene monomer in the composition Z3 lies in the range from 1 ppm to 100 ppm, preferably in the range from 3 ppm to 50 ppm and particularly preferably in the range from 5 ppm to 30 ppm, in each case based on the total weight of the composition Z3.

Surprisingly, it was found that the storage stability of compositions comprising polythiophenes, particularly of PEDOT/PSS dispersions, with regard to the "gelling behaviour" thereof, as well as the conductivity of layers obtained on the basis of said compositions or dispersions can be significantly improved if a particular content of unconverted thiophene monomer is established in said compositions or dispersions. If the concentration of unconverted thiophene monomers is below 1 ppm, then a significant increase in the conductivity can be achieved. If the concentration of unconverted thiophene monomer is above 100 ppm, then the composition or the dispersion is characterised by an impaired storage stability, which manifests in "gelling" of the composition or the dispersion after short storage times.

In method step I) of the method according to the invention, a composition Z1 comprising thiophene monomers and an oxidising agent is first provided.

The thiophene monomers used are preferably compounds having the formula (I)

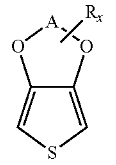

wherein

A stands for a possibly substituted $C_1$-$C_5$— alkylene residue,

R independently of each other, stands for H, a linear or branched, possibly substituted $C_1$-$C_{18}$-alkyl residue, a possibly substituted $C_5$-$C_{12}$-cycloalkyl residue, a possibly substituted $C_6$-$C_{14}$-aryl group, a possibly substituted $C_7$-$C_{18}$-aralkyl residue, a possibly substituted $C_1$-$C_4$-hydroxyalkyl residue or a hydroxyl residue, x stands for a whole number from 0 to 8, and in the event that a plurality of residues R are bound to A, said residues can be the same or different. The general formula (I) should be understood such that the substituent R can be bound x times to the alkylene residue A.

Particularly preferred are thiophene monomers having the general formula (I), where A stands for a possibly substituted $C_2$-$C_3$-alkylene group and x stands for 0 or 1. Especially preferred as a thiophene monomer is 3,4-ethylenedioxythiophene, which is polymerised in method step II) to obtain poly(3,4-ethylenedioxythiophene).

$C_1$-$C_5$-alkylene residues A according to the invention are preferably methylene, ethylene, n-propylene, n-butylene or n-pentylene. $C_1$-$C_{18}$-alkyl R preferably stands for linear or branched $C_1$-$C_{18}$-alkyl residues such as methyl, ethyl, n- or iso-propyl, n-, iso-, sec- or tert-butyl, n-pentyl, 1-methylbutyl, 2-methylbutyl, 3-methylbutyl, 1-ethylpropyl, 1,1-dimethylpropyl, 1,2-dimethylpropyl, 2,2-dimethylpropyl, n-hexyl, n-heptyl, n-octyl, 2-ethylhexyl, n-nonyl, n-decyl, n-undecyl, n-dodecyl, n-tridecyl, n-tetradecyl, n-hexadecyl or n-octadecyl, $C_5$-$C_{12}$-cycloalkyl residues R stand, for example, for cyclopentyl, cyclohexyl, cycloheptyl, cyclooctyl, cyclononyl or cyclodecyl, $C_6$-$C_{14}$-aryl residues R stand, for example, for phenyl or naphthyl, and $C_7$-$C_{18}$-aralkyl residues R stand, for example, for benzyl, o-, m-, p-tolyl, 2,3-, 2,4-, 2,5-, 2,6-, 3,4-, 3,5-xylyl or mesityl. The above listing serves for exemplary explanation of the invention and should not be regarded as exclusive.

Other possible substituents of the residues A and/or the residues R in the context of the invention are numerous organic groups, for example, alkyl-, cycloalkyl-, aryl-, aralkyl-, alkoxy-, halogen-, ether-, thioether-, disulfide-, sulfoxide-, sulfone-, sulfonate-, amino-, aldehyde-, keto-, carboxylic acid ester-, carboxylic acid-, carbonate-, carboxylate-, cyano-, alkylsilane- and alkoxysilane groups as well as carboxylamide groups.

The composition provided in method step I) also comprises, in addition to the thiophene monomer, an oxidising agent. As the oxidising agent, the oxidising agents suitable for oxidative polymerisation of pyrrole can be used; said oxidising agents are described, for example, in J. Am. Chem. Soc. 85, 454 (1963). Preferably, for practical reasons, economical and easily manipulated oxidising agents, for example, iron-III salts such as $FeCl_3$, $Fe(ClO_4)_3$ and the iron-III salts of organic acids and of inorganic acids having organic groups, also $H_2O_2$, $K_2Cr_2O_7$, alkali- and ammonium persulfates, alkali perborates, potassium permanganate and copper salts, such as copper tetrafluoroborate. The use of the persulfates and of the iron-III salts of organic acids and of inorganic acids having organic groups has the great advantage in practice, that they do not have a corrosive effect. Examples of iron-III salts of inorganic acids having organic groups are the iron-III salts of sulfuric acid semiesters of $C_1$-$C_{20}$-alkanols, for example, the Fe-III salt of lauryl sulfate. Examples of iron-III salts of organic acids are: the Fe-III salts of $C_1$-$C_{20}$-alkyl sulfonic acids, for example, methane and dodecane sulfonic acids; aliphatic $C_1$-$C_{20}$ carboxylic acids such as 2-ethylhexyl carboxylic acid; aliphatic perfluorocarboxylic acids, such as trifluoroethanoic and perfluorooctanoic acids; aliphatic dicarboxylic acids, for example, oxalic acid and above all, aromatic sulfonic acids, optionally substituted with $C_1$-$C_{20}$ alkyl groups, for example benzenesulfonic acid, p-toluenesulfonic acid and dodecylbenzene sulfonic acid.

According to a particularly preferable embodiment of the method according to the invention, the composition provided in method step I) also comprises a polyanion, wherein a polyanion is preferably understood to be a polymeric anion which comprises at least 2, preferably at least 3, particularly preferably at least 4, and especially preferably at least 10 identical, anionic monomer repeating units, which however do not necessarily have to be directly linked to one another.

Polyanions can be, for example, anions of polymeric carboxylic acids, for example, polyacrylic acids, polymethacrylic acid or polymaleic acid, or polymeric sulfonic acids, for example, polystyrene sulfonic acids and polyvinyl sulfonic acids. Said polycarboxylic and polysulfonic acids can also be copolymers of vinyl carboxylic acids and vinyl sulfonic acids with other polymerisable monomers, for example, acrylic acid esters and styrene. Preferably comprised in the dispersions provided in method step I) as a polyanion, is an anion of a polymeric carboxylic or sulfonic acid.

Particularly preferred as a polyanion is the anion of polystyrene sulfonic acid (PSS). The molecular weight of the polyacids providing the polyanions is preferably in the range from 1,000 to 2,000,000, particularly preferably 2,000 to 500,000. Determination of the molecular weight is carried out by means of gel permeation chromatography with the aid of polystyrene sulfonic acids having defined molecular weights as the calibration standard. The polyacids or the alkali salts thereof are commercially available, for example, polystyrene sulfonic acids and polyacrylic acids, or are produced with known methods (see, for example, Houben Weyl, Methoden der organischen Chemie [Methods of Organic Chemistry], vol. E20 Makromolekulare Stoffe [Macromolecular Substances], part 2 (1987), p. 1141 ff.).

The polyanion and the thiophene monomer can be comprised in the composition provided in method step I), particularly in a weight ratio in the range from 0.5:1 to 50:1, preferably in the range from 1:1 to 30:1, particularly preferably in the range from 2:1 to 20:1.

According to the invention, it is also preferable that the composition provided in method step I) comprises, besides the thiophene monomer, the oxidising agent and optionally the polyanion, a solvent or dispersant or a solvent and dispersant mixture, in which said components are dissolved or dispersed. The following substances are named, for example, as solvents and/or dispersants: aliphatic alcohols such as methanol, ethanol, i-propanol and butanol; aliphatic ketones such as acetone and methylethylketone; aliphatic carboxylic acid esters such as ethyl acetate and butyl acetate; aromatic hydrocarbons such as toluene and xylene; aliphatic hydrocarbons such as hexane, heptane and cyclohexane; chlorohydrocarbons such as dichloromethane and dichloroethane; aliphatic nitriles such as acetonitrile, aliphatic sulfoxides and sulfones such as dimethyl sulfoxide and sulfolane; aliphatic carboxylic acid amides such as methylacetamide, dimethylacetamide and dimethylformamide; aliphatic and araliphatic ethers such as diethylether and anisole. Furthermore, water or a mixture of water and the aforementioned organic solvents can be used as solvents or dispersants. Preferred solvents and dispersants are water or other protic solvents such as alcohols, for example, methanol, ethanol, i-propanol and butanol, as well as mixtures of water with said alcohols, a particularly preferred solvent or dispersant being water.

The quantity or concentration in which the thiophene monomers and polyanions are comprised in the composition prepared in method step I) is preferably chosen so that stable polythiophene/polyanion dispersions are obtained, the solid content of which lies in the range from 0.05% to 50% by weight, preferably 0.1% to 10% by weight and particularly preferably 0.8% to 2% by weight.

In method step II) of the method according to the invention, the thiophene monomers are oxidatively polymerised by reduction of the oxidising agent to a reduction product and oxidation of the thiophene monomer, to form a composition Z2 preferably comprising cationic polythiophene and the reduction product, wherein said polymerisation preferably takes place at a temperature in the range from 0° C. to 100° C. If polyanions are present in the compositions provided in method step I), cationic polythiophenes are obtained in the method step, which comprise polyanions as counterions for charge compensation, and which are often described by experts, as stated above, as polythiophene/polyanion complexes. According to the invention, particularly preferred polythiophene/polyanion complexes are PEDOT/PSS complexes.

The prefix "poly" should be understood, within the context of the invention, to mean that more than one identical or different repeating units is comprised in the polymer or polythiophene. The polythiophenes formed in method step II) comprise a total of n repeating units of the general formula (I), wherein n is a whole number from 2 to 2,000, preferably from 2 to 100. The repeating units of the general formula (I) within a polythiophene can be identical or different, depending on whether identical or different thiophene monomers were present in the composition prepared in method step I).

The polythiophenes formed in method step II) by oxidative polymerisation, and particularly the aforementioned poly(3,4-ethylenedioxythiophene), can be neutral or cationic. In a particularly preferred embodiment, they are cationic and the expression "cationic" relates only to the charges existing on the polythiophene main chain. Depending on the substituent on the groups R, the polythiophenes can carry positive and negative charges in the structural unit, wherein the positive charges are situated on the polythiophene main chain and the negative charges may possibly be situated on the groups R substituted with sulfonate or carboxylate groups. The positive charges of the polythiophene main chain can be partially compensated by the anionic groups optionally present on the groups R. Seen overall, the polythiophenes in these cases can be cationic, neutral or even anionic. Nevertheless, in the context of the invention, they are all considered to be cationic polythiophenes, since the positive charges on the polythiophene main chain are decisive. The number of positive charges is preferably at least 1 and a maximum of n, where n is the total number of all (identical or different) repeating units within the polythiophene.

In method step III) of the method according to the invention, the reduction product is at least partially removed from the composition Z2 obtained in method step II), resulting in a composition Z3. This removal of the reduction product preferably takes place with one or more ion exchangers. By means of this method, the composition obtained in method step II) is freed not only from the reduction product, but generally from salts still present. The ion exchanger(s) can be stirred, for example, into the composition Z2 obtained in method step II), or the composition Z2 obtained in method step II) is passed through one or more column(s) filled with ion exchanger. It is particularly preferable to treat the composition obtained in method step II) both with an anion exchanger and with a cation exchanger. Examples of suitable cation and anion exchangers are the ion exchangers obtainable from Lanxess AG under the trade name of LEWATIT®.

According to the invention, it is particularly preferable that the composition Z2 or the composition Z3 is a composition comprising a PEDOT/PSS complex. Preferably the composition Z2 or the composition Z3 is a PEDOT/PSS dispersion.

The method according to the invention is characterised in that it is ensured that the content of non-polymerised thiophene monomer in the composition Z3 is present in the range from 1 ppm to 100 ppm, preferably in the range from 3 ppm to 50 ppm and particularly preferably in the range from 5 ppm to 30 ppm, each in relation to the total weight of the composition Z3.

This can be ensured with different method variants.

It is possible, for example, to adjust the content of non-polymerised thiophene monomer in the composition Z3 in a targeted way, by using the oxidising agent in method step I) in a defined quantity ratio of oxidising agent:thiophene monomer.

Theoretically, for the oxidative polymerisation of the thiophene monomers of formula I, per mole of thiophene, 2.25 equivalents of oxidising agent are needed (see e.g. J. Polym. Sc., Part A, Polymer Chemistry, vol. 26, p. 1287 (1988)). However, in the prior art, the oxidising agent is normally used in a certain excess amount, e.g. an excess of 0.1 to 2 equivalents per mole of thiophene.

According to the invention, however, a particular content of non-polymerised thiophene monomer in the composition Z3 is achieved particularly in that the thiophene monomer is used in an excess amount based on the oxidising agent. In this context, it is particularly preferable that the oxidising agent in method step I)

a) in the case of an oxidising agent absorbing one electron per molecule is used in a molar ratio of oxidising agent: thiophene monomer of less than 2.33:1, b) and in the case of an oxidising agent absorbing two electrons per molecule is used in a molar ratio of oxidising agent:thiophene monomer of less than 1.16:1.

Aside from the possibility of specifically adjusting the content of thiophene monomers in the composition Z3 by means of the quantity ratio of oxidising agent: thiophene monomer, the possibility also exists of prematurely ending the polymerisation reaction according method step II) in that, for example, the oxidising agent is separated out by treating the reaction mixture with one or more ion exchangers. This measure can naturally also be combined with the measure described above (setting the quantity ratio of oxidising agent: thiophene monomer).

Furthermore, it is also possible in the event that the content of thiophene monomers in the composition Z3 in the chosen method conditions is below the minimum quantity of 1 ppm, to add EDT monomers in a specific manner to the composition Z3 or possibly as early as the composition Z2, in order to ensure the desired content of thiophene monomers in the composition Z3.

A contribution to solving the aforementioned problem is also made by a composition which is obtainable as composition Z3 with the method described above and which preferably has a content of non-polymerised thiophene monomers in the range from 1 ppm to 100 ppm, preferably in the range from 3 ppm to 50 ppm and particularly preferably in the range from 5 ppm to 30 ppm, in each case based on the total weight of the composition Z3.

A contribution to solving the aforementioned problem is also made by a composition comprising a polythiophene, wherein the composition comprises, in addition to the polythiophene, 1 ppm to 100 ppm, preferably 3 to 50 ppm and particularly preferably 5 ppm to 30 ppm of the thiophene monomer, on which the polythiophene is based, based on the total weight of the composition.

According to a preferred embodiment of the composition according to the invention; said composition comprises less than 500 ppm, particularly preferably less than 300 ppm and especially preferably, less than 100 ppm of inorganic anions, particularly sulfate ions, in each case based on the total weight of the composition.

According to a preferred embodiment of the composition according to the invention, the polythiophene is poly(3,4-ethylenedioxythiophene).

It is also preferred, according to the invention, that the composition also comprises, apart from the polythiophene, and preferably, apart from the poly(3,4-ethylenedioxythiophene), a polyanion, wherein as polyanions, the compounds which were given above as preferred polyanions in connection with the method according to the invention are preferred. In this connection, particularly preferred polyanions are anions of polystyrene sulfonic acid (PSS). In this regard, it is also preferable that the composition according to the invention comprises a PEDOT/PSS complex. As described above with regard to the method according to the invention, such compositions can be obtained in that 3,4-ethylenedioxythiophene is oxidatively polymerised in the presence of polystyrene sulfonic acid. In this regard, it is particularly preferable that the composition according to the invention is a PEDOT/PSS dispersion.

According to a particular embodiment of the composition according to the invention, said composition has at least one, but preferably all of the following properties:

i) a conductivity according to the test method described herein of at least 200 S/cm, preferably of at least 400 S/cm and particularly preferably of 500 S/cm;

ii) a PEDOT/PSS content in the range from 0.05% to 50% by weight, preferably from 0.1% to 10% by weight and particularly preferably from 0.8% to 2% by weight, in each case based on the total weight of the composition.

A contribution to solving the aforementioned problem is also made by a layer construction, comprising A) a substrate with a substrate surface and B) a layer at least partially covering the substrate surface, wherein the layer is formed from the solid comprised in the composition according to the invention or in the composition obtainable through the method according to the invention.

Substrates that are preferable in this context are plastics films, and particularly preferable are transparent plastics films which usually have a thickness in the range from 5 μm to 5,000 μm, preferably in the range from 10 μm to 2,500 μm and particularly preferably in the range from 100 μm to 1,000 μm. Such plastics films can be based, for example, on polymers such as polycarbonates, polyesters, for example, PET and PEN (polyethylene terephthalate or polyethylene naphthalene dicarboxylate), copolycarbonates, polysulfones, polyethersulfones (PES), polyimides, polyamides, polyethylene, polypropylene or cyclic polyolefins or cyclic olefin copolymers (COC), polyvinyl chloride, polystyrene, hydrated styrene polymers or hydrated styrene copolymers.

The surface of the substrates can optionally be pre-treated before coating with the composition according to the invention, for example, by corona treatment, flame treatment, fluorination or plasma treatment, in order to improve the polarity of the surface and thus to improve the wettability and the chemical affinity.

Before the composition according to the invention or the composition obtainable with the method according to the invention is applied to the substrate surface for the purpose of forming a layer, further additives which increase the conductivity can be added to the composition, for example, compounds comprising ether groups, for example, tetrahydrofuran, lactone group-comprising compounds such as butyrolactone, valerolactone, amide- or lactam-group comprising compounds such as caprolactam, N-methylcaprolactam, N,N-dimethylacetamide, N-methylacetamide, N,N-dimethylformamide (DMF), N-methylformamide, N-methylformanilide, N-methylpyrrolidone (NMP), N-octylpyrrolidone, pyrrolidone, sulfones and sulfoxides, for example, sulfolane (tetramethylene sulfone), dimethyl sulfoxide (DMSO), sugar or sugar derivatives, for example, sucrose, glucose, fructose, lactose, sugar alcohols, for example, sorbitol, mannitol, furan derivates, for example, 2-furancarboxylic acid, 3-furancarboxylic acid, and/or di- or polyalcohols, for example, ethylene glycol, glycerin or di- or triethylene glycol. Particularly preferably, as conductivity-increasing additives, tetrahydrofuran, N-methylformamide, N-methylpyrrolidone, ethylene glycol, dimethyl sulfoxide or sorbitol are used.

One or more organic binding agents soluble in organic solvents or in water, for example, polyvinylacetate, polycarbonate, polyvinylbutyral, polyacrylic acid esters, polyacrylic acid amides, polymethacrylic acid esters, polymethacrylic acid amides, polystyrene, polyacrylonitrile, polyvinylchloride, polyvinylpyrrolidones, polybutadiene, polyisoprene, polyethers, polyesters, polyurethanes, polyamides, polyimides, polysulfones, silicones, epoxy resins, styrene/acrylic acid ester-, vinylacetate/acrylic acid ester- and ethylene/vinylacetate-copolymers, polyvinyl alcohols or celluloses can also be added to the composition. The proportion of polymer binding agent, where added, is usually in the range from 0.1% to 90% by weight, preferably in the range from 0.5% to 30% by weight and particularly preferably 0.5% to 10% by weight, based on the total weight of the coating composition.

In order to adjust the pH value, for example, acids or bases can be added to the coating compositions. Preferably such additives do not impair the film formation of the dispersions, such as for example the bases 2-(dimethylamino)-ethanol, 2,2'-iminodiethanol or 2,2',2''-nitrilotriethanol, as well as ammonia.

The coating composition can then be applied using known methods, for example, by spin-coating, dipping, pouring, dropping, injecting, spraying, doctor blade application, painting or printing, for example, inkjet, screen printing, intaglio, offset or pad printing onto the substrate in a wet film thickness in the range from 0.5 μm to 250 μm, preferably in a wet film thickness in the range from 2 μm to 50 μm and subsequently dried at a temperature in the range from 20° C. to 200° C.

Preferably, the layer at least partially covering the substrate surface has a layer thickness in the laminated bodies according to the invention in the range from 0.01 μm to 50 μm, particularly preferably in the range from 0.1 μm to 25 μm and especially preferably in the range from 1 μm to 10 μm.

It is further preferable, with regard to the layer construction according to the invention, that the layer B) shows the following properties:

B1) the internal transmission of the layer is greater than 50%, preferably greater than 70% and particularly preferably greater than 80%;

B2) a conductivity according to the test method described herein of at least 200 S/cm, preferably of at least 400 S/cm and particularly preferably of at least 500 S/cm;

In some cases, an internal transmission of up to 99.5% is achieved. Also in some cases, a conductivity of up to 1,500 S/cm is achieved.

A contribution to solving the aforementioned problems is also made by an electronic component comprising a laminate body according to the invention. Preferred electronic components are, in particular, organic light-emitting diodes, organic solar cells or capacitors, wherein the use in capacitors, particularly the use as solid electrolyte in capacitors with aluminium oxide as the dielectric is particularly preferable.

A contribution to solving the aforementioned problems is also made by the use of a composition according to the invention or a composition obtainable with the method according to the invention for producing an electrically conductive layer in electronic components, particularly in organic light-emitting diodes, organic solar cells or capacitors.

The invention will now be described in greater detail by reference to figures, test methods and non-restricting examples.

Test Methods

Where not otherwise stated, the tests were carried out in a laboratory at a temperature of 21° C. at an atmospheric humidity in the range from 50% to 70% and at atmospheric pressure.

Determination of the 3,4-ethylenedioxythiophene Content

The quantity of EDT in the PEDOT: PSS dispersion is determined with the aid of an HPLC (High Performance Liquid Chromatograph) with a UV-Vis detector attached, with associated software.

A model 1100 HPLC from Agilent Technologies was used. For the evaluation, an Agilent Technologies Chem Station was used. The column used from Thermo Keystone was 12.5 cm long, with a diameter of 4.6 mm and was filled with Hypersil ODS 2. The eluting agent was a mixture of 400 ml acetonitrile and 600 ml water. The fluid speed was 1 ml/min and the column temperature was 25° C. The injection volume was 20 μl and the run time was 9 min.

For calibration, a standard solution was used. For this purpose, 2 g EDT was placed in a 100 ml measuring cylinder, which was then filled with methanol.

In order to determine the EDT content in a measuring sample, 2.000 g of the dispersion was placed in a 10 ml measuring cylinder, which was then filled with methanol. The mixture was treated with ultrasound and subsequently passed through a 0.45 μm syringe filter (Millipore Millex HV). Subsequently, 20 μl of the solution was injected.

Detection of the EDT band was carried out at a wavelength of 257 nm. On the basis of the calibration, EDT concentrations in the range from 0.5 mg/kg to 100 mg/kg were found.

Determination of Conductivity

A cleaned glass substrate was laid on a spin coater and 10 ml of the composition according to the invention was distributed over the substrate. The remaining solution was then spun off by rotation of the plate. Thereafter, the substrate thus coated was dried for 15 minutes at 130° C. on a hot plate. The layer thickness was then determined by means of a layer thickness measuring device. (Tencor, Alphastep 500). The conductivity was determined in that Ag electrodes of 2.5 cm length were vapour deposited at a distance of 10 mm via a shadow mask. The surface resistance determined with an electrometer (Keithly 614) was multiplied by the layer thickness in order to obtain the specific electrical resistivity. The conductivity is the inverse of the specific electrical resistivity.

Determination of Gelling Behaviour 20 g of the composition was placed in a 250 ml beaker. The composition was then poured over a smooth plastics surface having an inclination angle of 45°.

Figure 1:
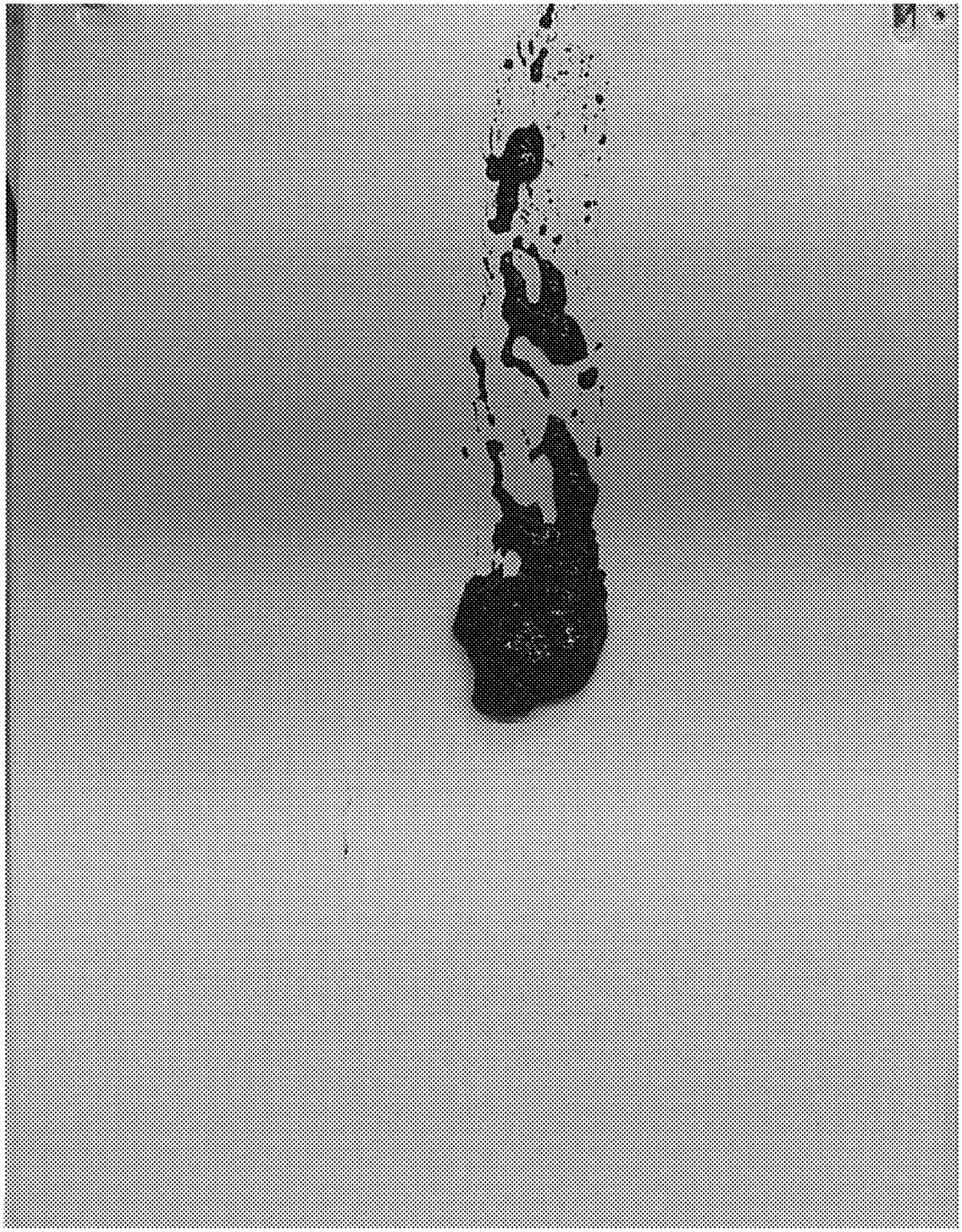
FIG. 1 shows the flow of a gelled composition over a plastics surface, wherein the material remains in lumps in places. The flow is not uniform, but repeatedly ruptures.

In the case of a gelled composition, the following effects occur:

a) When poured out of the beaker, the composition does not flow evenly, but leaves behind regions where the composition remains stuck in lumps on the glass wall and regions in which hardly any composition remains.

b) When the material flows over the plastics surface, the material remains in lumps in places. The flow is not uniform, but repeatedly ruptures. [FIG. 1]

In the case of a homogeneous composition, the following effects occur:

A) When poured out, a uniform film remains on the beaker wall which is thicker or thinner depending on the viscosity of the composition. In every case, the film is uniform and does not show any unevenness.

Figure 2:
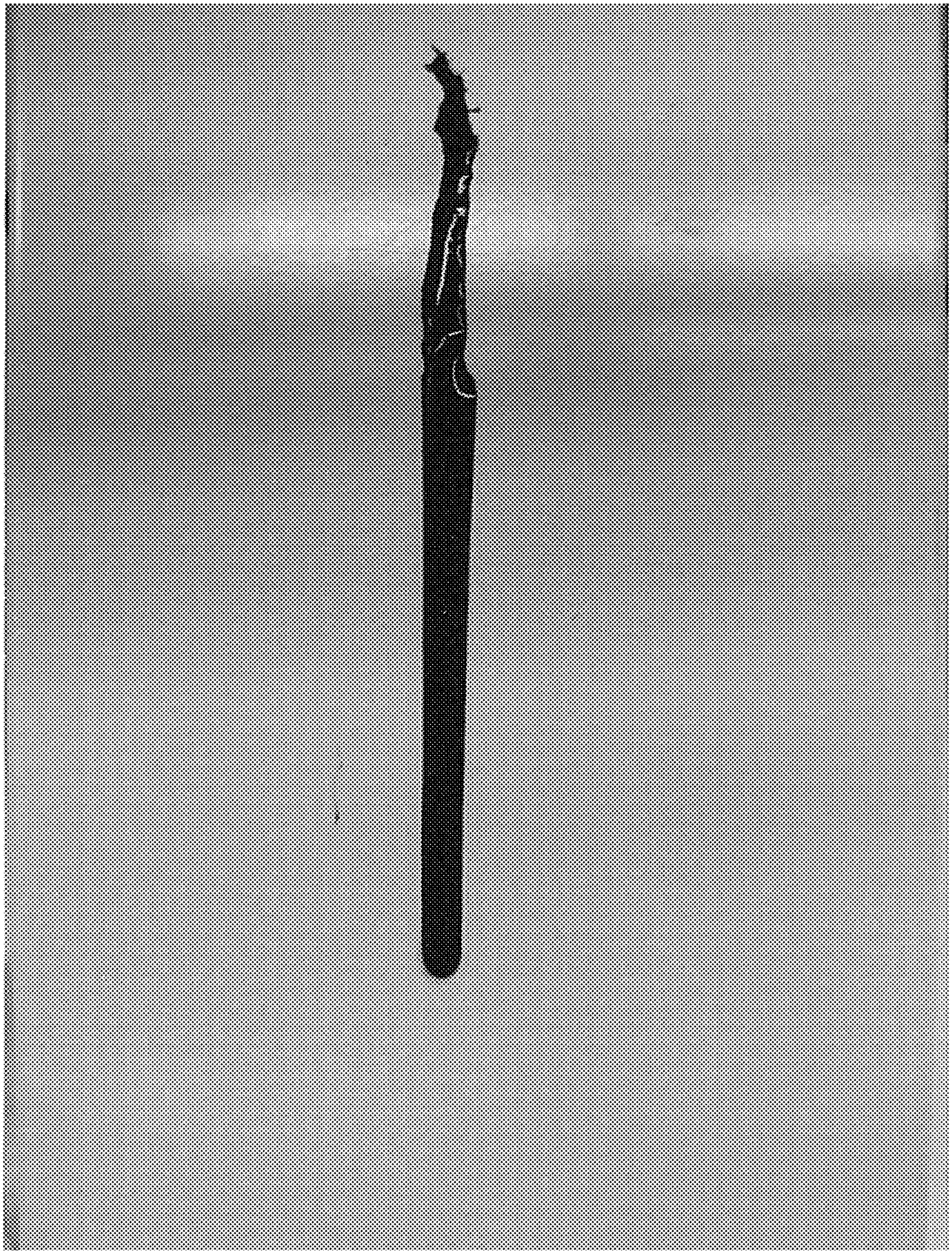
FIG. 2 shows the flow of a homogenous composition over a plastics surface, wherein, when the material remains flows over the plastics surface, a uniform film is produced.

B) When the material flows over the plastics surface, a uniform film is produced. [FIG. 2]

Based on these criteria, a composition can be classified as gelled or homogeneous.

Determination of Transmission

The transmission of the coated substrate was determined with a 2-channel spectrometer (Lambda900 from PerkinElmer). In order additionally to detect any portions of the transmitted light scattered by the sample, the device was equipped with a photometer sphere (Ulbricht Sphere). The sample to be measured was fixed in the input aperture of the photometer sphere.

Next, the spectral transmission of the substrate without the coating was measured. The substrates used were glass plates with a thickness of 2 mm, cut into 50 mm×50 mm squares. For coating of the substrate, the substrate was laid on a spin coater and 10 ml of the composition according to the invention was distributed over the substrate. The remaining solution was then spun off by rotation of the plate. Thereafter, the substrate thus coated was dried for 15 minutes at 130° C. on a hot plate.

Next, the spectral transmission of the substrate with the coating was measured. The coating on the substrate was then directed toward the sphere, in front of the sphere.

The transmission spectra in the visible light region were recorded, i.e. from 320 nm to 780 nm, with a step width of 5 nm. From the spectra, the standard colour value Y (brightness) of the sample was calculated according to DIN 5033, on the basis of a 10°-observer and the light type D65. The internal transmission was calculated from the ratio of brightness of the substrate with the coating (Y) to that without the coating (Y0) as follows:

Internal transmission corresponds to Y/Y0*100 percent.

EXAMPLES

Example 1

Production of a PEDT/PSS-Dispersion without EDT Excess

Comparative Example

Into a 3-litre glass cylinder equipped with a stirrer, a material inlet, a gas inlet pipe and a temperature-control jacket with thermostat attached was placed 2,050 g water, 500 g aqueous polystyrene sulfonic acid solution (5.0%, Mw=70,000 g/mol) and 5.6 g of a 10% iron(III)-sulfate solution. The stirrer rotated at 50 rpm. The temperature was set to 18° C. Nitrogen was fed through the solution for 30 min via the gas line. Subsequently, 10.13 g 3,4-ethylenedioxythiophene (71.2 mmol; Clevios MV2, from H.C. Starck Clevios GmbH) was introduced through the material inlet. Then 23.7 g sodium peroxodisulfate (99.5 mmol) was added through the material inlet. The mixture was stirred for 18 h at 18° C. Following completion of the reaction, the mixture was transferred to a plastic beaker and 500 ml of a cation exchanger (Lewatit S100 H, from Lanxess AG) and 290 ml of an anion exchanger (Lewatit MP 62, from Lanxess AG) added to remove inorganic salts. The mixture was stirred for 2 h and the Lewatit filtered out. Finally, the mixture was passed through a 10 μm filter.

The EDT content of the dispersion was determined. It was 0 mg/kg.

To 19 g of the sample was added 1 g dimethyl sulfoxide (DMSO) and the conductivity was determined. It was 370 S/cm.

Furthermore, the gelling behaviour of the dispersion was investigated after production and again 14 days following production. In both cases, the dispersion was assessed as being homogeneous.

Example 2

Production of a PEDT/PSS Dispersion with a Large EDT Excess

Further Comparative Example

Into a 3-litre glass cylinder equipped with a stirrer, a material inlet, a gas inlet pipe and a temperature-control jacket with thermostat attached was placed 2,050 g water, 500 g aqueous polystyrene sulfonic acid solution (5.0%, Mw=70,000 g/mol) and 5.6 g of a 10% iron(III)-sulfate solution. The stirrer rotated at 50 rpm. The temperature was set to 18° C. Nitrogen was fed through the solution for 30 min via the gas line. Subsequently, 10.13 g 3,4-ethylenedioxythiophene (71.2 mmol; Clevios MV2, from H.C. Starck Clevios GmbH) was introduced through the material inlet. Then 18.6 g sodium peroxodisulfate (78.1 mmol) was added through the material inlet. The mixture was stirred for 18 h at 18° C. Following completion of the reaction, the mixture was transferred to a plastic beaker and 500 ml of a cation exchanger (Lewatit S100 H, from Lanxess AG), and 290 ml of an anion exchanger (Lewatit MP 62, from Lanxess AG) added to remove inorganic salts. The mixture was stirred for 2 h and the Lewatit filtered out. Finally, the mixture was passed through a 10 μm filter.

The EDT content of the dispersion was determined. It was 430 mg/kg.

To 19 g of the sample was added 1 g dimethyl sulfoxide (DMSO) and the conductivity was determined. It was 540 S/cm.

Following filtration of the dispersion, the gelling behaviour thereof was also determined. The dispersion was assessed as being homogeneous. After 14 days, the gelling behaviour was investigated anew. Gelling was found to occur.

Example 3

Production of a PEDT/PSS Dispersion with a Large EDT Excess

According to the Invention

Into a 3-litre glass cylinder equipped with a stirrer, a material inlet, a gas inlet pipe and a temperature-control jacket with thermostat attached was placed 2,050 g water, 500 g aqueous polystyrene sulfonic acid solution (5.0%, Mw=70,000 g/mol) and 5.6 g of a 10% iron(III)-sulfate solution. The stirrer rotated at 50 rpm. The temperature was set to 18° C. Nitrogen was fed through the solution for 30 min via the gas line. Subsequently, 10.13 g ethylenedioxythiophene (71.2 mmol; Clevios M V2, from H.C. Starck Clevios GmbH) was introduced through the material inlet. Then 19.5 g sodium peroxodisulfate (81.9 mmol) was added through the material inlet. The mixture was stirred for 18 h at 18° C. Following completion of the reaction, the mixture was transferred to a plastic beaker and 500 ml of a cation exchanger (Lewatit S100 H, from Lanxess AG) and 290 ml of an anion exchanger (Lewatit MP 62, from Lanxess AG) added to remove inorganic salts. The mixture was stirred for 2 h and the Lewatit filtered out. Finally, the mixture was passed through a 10 μm filter.

The EDT content of the dispersion was determined. It was 27 mg/kg.

To 19 g of the sample was added 1 g dimethyl sulfoxide (DMSO) and the conductivity was determined. It was 580 S/cm.

Furthermore, the gelling behaviour of the dispersion was investigated after production and again 14 days following production. In both cases, the dispersion was assessed as being homogeneous.

A glass substrate was coated with the dispersion according to the method for conductivity determination. The layer thickness was determined as described in the method headed "Determination of Conductivity" and was found to be 161 nm. The internal transmission was 84.3%

Example 4

Production of a PEDT/PSS Dispersion with a Large EDT Excess

According to the Invention

The synthesis of the PEDOT/PSS dispersion was carried out similarly to Example 3. Following the addition of ion exchanger, the mixture was stirred for 3 h and then the ion exchanger was filtered out. The mixture was then filtered.

The EDT content of the dispersion was determined. It was 15 mg/kg.

To 19 g of the sample was added 1 g dimethyl sulfoxide (DMSO) and the conductivity was determined. It was 580 S/cm.

Furthermore, the gelling behaviour of the dispersion was investigated after production and again 14 days following production. In both cases, the dispersion was assessed as being homogeneous.

Example 5

Production of a PEDT/PSS Dispersion with a Large EDT Excess

According to the Invention

The synthesis of the PEDOT/PSS dispersion was carried out similarly to Example 3. Following the addition of ion exchanger, the mixture was stirred for 14 h and then the ion exchanger was filtered out. The mixture was then filtered.

The EDT content of the dispersion was determined. It was 3 mg/kg.

To 19 g of the sample was added 1 g dimethyl sulfoxide (DMSO) and the conductivity was determined. It was 570 S/cm.

Furthermore, the gelling behaviour of the dispersion was investigated after production and again 14 days following production. In both cases, the dispersion was assessed as being homogeneous.

The measurement results from Examples 1 to 5 are summarised again in the following table:

| Example No. | Molar ratio of oxidising agent:EDT | Solids content [%] | Content of EDT in the dispersion after filtration [mg/kg] | Conductivity [S/cm] | Flow behaviour after 2 weeks |
|---|---|---|---|---|---|
| 1 | 1.40 | 1.14 | 0 | 370 | Homogeneous |
| 2 | 1.10 | 1.10 | 430 | 540 | Gelled |
| 3 | 1.15 | 1.15 | 27 | 580 | Homogeneous |
| 4 | 1.15 | 1.15 | 15 | 580 | Homogeneous |
| 5 | 1.15 | 1.15 | 3 | 570 | Homogeneous |

The results show that a particularly advantageous combination of the properties high conductivity and advantageous storage stability can be achieved if an EDT content in the range from 1 ppm to 100 ppm in the PEDOT/PSS dispersion is ensured. If the EDT content is lower than 1 ppm, although advantageous storage stability is achieved, the conductivity is relatively low. If the EDT content is greater than 100 ppm, the conductivity is high, but only at the cost of poorer storage stability.

The invention claimed is:

1. A method for producing a composition comprising polythiophene, comprising the method steps:

I) provision of a composition Z1 comprising thiophene monomers and an oxidising agent;

II) oxidative polymerisation of the thiophene monomers by reducing the oxidising agent to a reduction product and oxidation of the thiophene monomer, to form a composition Z2 comprising a polythiophene and the reduction product;

III) at least partial removal of the reduction product from the composition Z2 obtained in method step II), to obtain a composition Z3;

wherein the composition Z3 has a content of non-polymerised thipohene monomer in the range from 5 ppm to 100 ppm, based on the total weight of the composition Z3.

2. The method according to claim 1, wherein following completion of method step III), the content of non-polymerised thiophene monomer in the composition Z3 is in a range from 5 ppm to 50 ppm, based on the total weight of the composition Z3.

3. The method according to claim 1, wherein following completion of method step III), the content of non-polymerised thiophene monomer in the composition Z3 is in the range from 5 ppm to 30 ppm, based on the total weight of the composition Z3.

4. The method according to claim 1, wherein the thiophene monomer is 3,4-ethylenedioxythiophene (EDT) and the polythiophene is poly(3,4-ethylenedioxythiophene) (PEDOT).

5. The method according to claim 1, wherein, in addition to the thiophene monomer and the oxidising agent, the solution provided in method step I) also comprises a polyanion.

6. The method according to claim 5, wherein the polyanion is a polystyrene sulfonic acid (PSS).

7. The method according to claim 1, wherein the composition Z3 obtained in method step III) is a PEDOT/PSS dispersion.

8. The method according to claim 1, wherein the oxidising agent in method step I)

a) in the case of an oxidising agent absorbing one electron per molecule is used in a molar ratio of oxidising agent : thiophene monomer of less than 2.33:1, b) and in the case of an oxidising agent absorbing two electrons per molecule is used in a molar ratio of oxidising agent : thiophene monomer of less than 1.16:1.

9. The method according to claim 1, wherein the at least partial removal of the reduction product in method step III) takes place through the treatment of the composition Z2 with an ion exchanger.

10. A composition obtained as composition Z3 using a method comprising:

I) provision of a composition Z1 comprising thiophene monomers and an oxidising agent;

II) oxidative polymerisation of the thiophene monomers by reducing the oxidising agent to a reduction product and oxidation of the thiophene monomer, to form a composition Z2 comprising a polythiophene and the reduction product;

III) at least partial removal of the reduction product from the composition Z2 obtained in method step II), to obtain a composition Z3;

wherein the composition Z3 has a content of non-polymerised thipohene monomer in the range from 5 ppm to 100 ppm, based on the total weight of the composition Z3.

11. A composition comprising a polythiophene, wherein, in addition to the polythiophene, the composition comprises in the range from 5 ppm to 100 ppm of the thiophene monomer on which the polythiophene is based, based on the total weight of the composition.

12. The composition according to claim 11, wherein the composition comprises in the range of from 5 ppm to 50 ppm of the thiophene monomer on which the polythiophene is based, based on the total weight of the composition.

13. The composition according to claim 11, wherein the composition comprises in the range from 5 ppm to 30 ppm of the thiophene monomer on which the polythiophene is based, based on the total weight of the composition.

14. The composition according to claim 11, wherein the composition comprises less than 500 ppm of inorganic anions, based on the total weight of the composition.

15. The composition according to claim 11, wherein the polythiophene is poly(3,4-ethylenedioxythiophene) and the thiophene monomer is 3,4-ethylenedioxythiophene.

16. The composition according to claim 11, wherein, in addition to the polythiophene, the composition comprises a polyanion.

17. The composition according to claim 16, wherein the polyanion is a polystyrene sulfonic acid.

18. The composition according to claim 11, wherein the composition is a PEDOT/PSS dispersion.

19. The composition according to claim 11, wherein, the composition has at least one of the following properties:

i) a conductivity of at least 500 S/cm;

ii) a PEDOT/PSS content in the range from 0.8% to 2% by weight, based on the total weight of the composition.

20. A layer construction, comprising

A) a substrate with a substrate surface and

B) a layer at least partially covering the substrate surface, wherein the layer is formed from the solid comprised in a composition according claim 10.

21. The layer construction according to claim 20, wherein the layer B) has the following properties:

B1) the internal transmission of the layer is greater than 80%;

B2) the conductivity of the layer is at least 500 S/cm.

22. An electronic component comprising a layer construction according to claim 20.

23. A method for producing an electrically conductive layer in an electronic component, the method comprising applying the composition of claim 10 to a substrate surface.

* * * * *